(12) United States Patent
Thadani et al.

(10) Patent No.: US 8,921,235 B2
(45) Date of Patent: Dec. 30, 2014

(54) CONTROLLED AIR GAP FORMATION

(71) Applicant: Applied Materials Inc., Santa Clara, CA (US)

(72) Inventors: Kiran V. Thadani, Sunnyvale, CA (US); Jingjing Xu, Cupertino, CA (US); Abhijit Basu Mallick, Palo Alto, CA (US); Joe Griffith Cruz, San Jose, CA (US); Nitin K. Ingle, San Jose, CA (US); Pravin K. Narwankar, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/834,508

(22) Filed: Mar. 15, 2013

(65) Prior Publication Data
US 2014/0248754 A1 Sep. 4, 2014

Related U.S. Application Data

(60) Provisional application No. 61/772,267, filed on Mar. 4, 2013.

(51) Int. Cl.
*H01L 21/00* (2006.01)
*H01L 21/20* (2006.01)

(52) U.S. Cl.
CPC .................................. *H01L 21/2015* (2013.01)
USPC .... 438/725; 438/737; 438/740; 257/E21.278; 257/E21.273; 257/E21.277; 257/E21.573; 257/E21.585

(58) Field of Classification Search
CPC ....................................................... H01L 21/00
USPC ......... 438/424, 435, 761, 700, 221, 427, 436, 438/438; 257/E21.278, E21.273, E21.277, 257/E21.573, E21.585
See application file for complete search history.

(56) References Cited

U.S. PATENT DOCUMENTS 5,461,003 A 10/1995 Havemann et al.
6,265,321 B1 7/2001 Chooi et al.
(Continued)

FOREIGN PATENT DOCUMENTS

KR K102010027580 A 3/2010
KR K1020130015167 A 2/2013

OTHER PUBLICATIONS

International Search Report and Written Opinion of the International Searching Authority for PCT Application No. PCT/US2011/051226, mailed on Apr. 24, 2012, 11 pages.

(Continued)

*Primary Examiner* — Telly Green
(74) *Attorney, Agent, or Firm* — Kilpatrick Townsend & Stockton LLP (57) ABSTRACT

A method of forming and controlling air gaps between adjacent raised features on a substrate includes forming a silicon-containing film in a bottom region between the adjacent raised features using a flowable deposition process. The method also includes forming carbon-containing material on top of the silicon-containing film and forming a second film over the carbon-containing material using a flowable deposition process. The second film fills an upper region between the adjacent raised features. The method also includes curing the materials at an elevated temperature for a period of time to form the air gaps between the adjacent raised features. The thickness and number layers of films can be used to control the thickness, vertical position and number of air gaps.

26 Claims, 8 Drawing Sheets

(56) References Cited

U.S. PATENT DOCUMENTS

| | | | |
|---|---|---|---|
| 6,287,979 | B1 | 9/2001 | Zhou et al. |
| 6,555,467 | B2 | 4/2003 | Hsu et al. |
| 6,872,654 | B2 | 3/2005 | Chen et al. |
| 7,022,582 | B2* | 4/2006 | Sezi ............... 438/422 |
| 7,041,571 | B2 | 5/2006 | Strane et al. |
| 7,256,127 | B2 | 8/2007 | Gallagher et al. |
| 7,582,555 | B1 | 9/2009 | Lang et al. |
| 7,666,754 | B2 | 2/2010 | Toma et al. |
| 7,781,301 | B2 | 8/2010 | Watanabe et al. |
| 7,781,352 | B2 | 8/2010 | Fukazawa et al. |
| 7,790,634 | B2 | 9/2010 | Munro et al. |
| 2006/0246681 | A1 | 11/2006 | Li et al. |
| 2007/0010072 | A1 | 1/2007 | Bailey et al. |
| 2008/0038518 | A1 | 2/2008 | Gallagher et al. |
| 2010/0081293 | A1 | 4/2010 | Mallick et al. |
| 2011/0151677 | A1* | 6/2011 | Wang et al. ............ 438/773 |
| 2011/0217851 | A1* | 9/2011 | Liang et al. ............ 438/786 |
| 2011/0221062 | A1 | 9/2011 | Clevenger et al. |
| 2012/0070957 | A1* | 3/2012 | Mallick et al. ......... 438/422 |
| 2012/0142192 | A1* | 6/2012 | Li et al. ................. 438/700 |
| 2012/0205774 | A1* | 8/2012 | Wang .................... 257/506 |
| 2013/0217240 | A1* | 8/2013 | Mallick et al. ......... 438/778 |
| 2013/0260533 | A1* | 10/2013 | Sapre et al. ........... 438/435 |
| 2013/0260564 | A1* | 10/2013 | Sapre et al. ........... 438/703 |
| 2013/0288485 | A1* | 10/2013 | Liang et al. ........... 438/782 |
| 2014/0045342 | A1* | 2/2014 | Mallick et al. ......... 438/778 |
| 2014/0170847 | A1* | 6/2014 | Iuchi et al. ............ 438/597 |

OTHER PUBLICATIONS

Ligatchev and Wong, "On Distributions of Defect States in Low-$k$ Carbon Doped Silicon Dioxide Films in Vicinity of Fermi Level", *Electrochemical and Solid-State Letters*, 7(12):F89-F92 (2004).

Non-Final Office Action for U.S. Appl. No. 13/229,673 mailed on Aug. 27, 2012, 9 pages.

Final Office Action for U.S. Appl. No. 13/229,673 mailed on Dec. 19, 2012, 9 pages.

Non-Final Office Action for U.S. Appl. No. 13/229,673 mailed on Jun. 17, 2013, 11 pages.

Final Office Action for U.S. Appl. No. 13/229,673 mailed on Oct. 15, 2013, 12 pages.

International Search Report and Written Opinion dated Jun. 25, 2014 for International Application No. PCT/US2014/017350, 10 pages.

* cited by examiner

CONTROLLED AIR GAP FORMATION

CROSS-REFERENCES TO RELATED APPLICATIONS

This application claims priority to U.S. Provisional Patent Application No. 61/772,267, filed Mar. 4, 2013. The disclosure of which is hereby incorporated by reference in its entirety for all purposes.

BACKGROUND

Embodiments of the present invention relate to methods of filling gaps between adjacent raised features on substrates, such as semiconductor wafers, with dielectric material.

Semiconductor device geometries have dramatically decreased in size since their introduction several decades ago. Modern semiconductor fabrication equipment is routinely used to produce devices having geometries as small as 28 nm and less, and new equipment designs are continually being developed and implemented to produce devices with even smaller geometries. As device geometries decrease, the impact of interconnect capacitance on device performance increases. To reduce interconnect capacitance, inter-layer materials that have traditionally been formed of silicon oxide are being formed using lower dielectric constant materials (low k materials). Some low k materials that have been used include fluorinated silicon oxide, carbonated silicon oxide, and various polymers and aerogels. While these and other low k materials have been used successfully in the manufacture many different types of integrated circuits, new and improved processes that can create regions of low dielectric constant material between adjacent raised features on substrates are desirable.

SUMMARY

Methods of the present invention form air gaps (e.g., spaces having a vacuum or gas) between adjacent raised features on substrates. In one embodiment, the air gaps comprise one or more pores of a porous low k material. In another embodiment, the air gaps are primarily voids that extend substantially across the width of a gap formed between a first raised feature and a second adjacent raised feature. The air gaps can have a dielectric constant as low as 1.0, thus reducing the interconnect capacitance of the overall stack of materials used to fill the gap between the adjacent raised structures. The air gaps can be formed with a consistent shape that is independent of size of the space. The size, position and number of air gaps can be controlled by varying the thickness and the number of layers used to form the air gaps.

In accordance with an embodiment of the present invention, a method of forming air gaps between adjacent raised features on a substrate includes forming a first silicon-containing film in a bottom region between the adjacent raised features using a flowable deposition process. A subsequent carbon-containing material is formed on top of the first silicon-containing film. The method also includes forming a second silicon-containing film over the carbon-containing material using a flowable deposition process. The second silicon-containing film may fill an upper region between the adjacent raised features and extend over the adjacent raised features. The method also includes curing the carbon-containing material and the silicon-containing material at an elevated temperature for a period of time to form the air gaps between the adjacent raised features. The size and the position of the air gap can be controlled by varying the thickness of the first silicon-containing film, the carbon-containing material and the second silicon-containing film.

In some embodiments the carbon-containing material is a hydrocarbon material deposited using a flowable deposition process. The hydrocarbon material may be substantially free of silicon.

In an embodiment, the carbon-containing material is formed using a flowable chemical vapor deposition (CVD) process.

In another embodiment, the carbon-containing material comprises silicon, oxygen, and carbon.

In another embodiment, the carbon-containing material is substantially free of silicon.

In another embodiment, the silicon-containing films are formed using a flowable CVD process.

In another embodiment, the silicon-containing films are substantially free of carbon.

In yet another embodiment, a density of the silicon-containing films increases after the cure and the second silicon-containing film extends over the air gaps.

In accordance with another embodiment of the present invention, a method of forming air gaps between adjacent raised features on a substrate includes forming a first silicon-containing film in a bottom region between the adjacent raised features using a flowable deposition process. A subsequent first carbon-containing material is formed on top of the first silicon-containing film and a second silicon-containing film is formed over the first carbon-containing material using a flowable deposition process. The method also includes forming one or more stacks of a carbon-containing layer followed by a silicon-containing layer on top of the second silicon-containing film until an upper region between the adjacent raised features and extending over the adjacent raised features is filled. The method also includes curing the carbon-containing materials and the silicon-containing materials at an elevated temperature for a period of time to form the air gaps between the adjacent raised features. The size and position of the air gaps can be controlled by varying the thickness of the first silicon-containing film, the carbon-containing material and the second silicon-containing film. The number of air gaps can be controlled by changing the number of stacks of carbon-containing layers followed by silicon-containing layers.

In some embodiments the carbon-containing material is a hydrocarbon material deposited using a flowable deposition process. The hydrocarbon material may be substantially free of silicon.

In another embodiment the carbon-containing material is a carbon-doped silicon oxide.

In an embodiment, the hydrocarbon material is formed using a flowable CVD process.

In another embodiment, a density of the silicon-containing films increases after the cure and the third silicon-containing film extends over the air gaps.

Additional embodiments and features are set forth in the description that follows and will become apparent to those skilled in the art upon examination of the specification. Features and advantages may be realized and attained by means of the instrumentalities, combinations, and methods described in the specification.

BRIEF DESCRIPTION OF THE DRAWINGS

A further understanding of the nature and advantages of the present invention may be realized by reference to the remaining portions of the specification and drawings. Like reference numerals are used throughout the several drawings to refer to similar components.

DETAILED DESCRIPTION

Methods of the present invention reduce interconnect capacitance by forming air gaps between adjacent raised features on substrates. The air gaps may include a vacuum or gas. The air gaps may be formed, for example, in trenches or between metal lines during the manufacture of semiconductor devices. In one embodiment, the air gaps include one or more pores of a porous low k material. In another embodiment, the air gaps include primarily a void and extend substantially from a first raised feature to a second adjacent raised feature. The air gaps may be formed using carbon-containing materials that provide air gaps having a consistent shape despite being formed in spaces of different sizes.

Figure 1A:
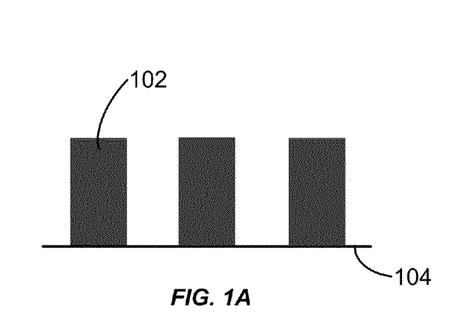
FIGS. 1A-1F are simplified cross-sectional drawings illustrating a method of forming air gaps between adjacent raised features on a substrate according to an embodiment of the invention.

FIGS. 1A-1F are simplified cross-sectional drawings illustrating a method of forming air gaps between adjacent raised features on a substrate according to an embodiment of the invention. FIG. 1A shows raised features 102 on substrate 104. Only a surface of substrate 104 is shown. The raised features 102 may be metal lines on a surface of substrate 104, conductive lines overlaying devices formed in or on the substrate, trenches formed in an upper portion of the substrate, or the like. Substrate 104 may be used, for example, to make semiconductor devices, flat panel displays (such as TFTs), energy conversion and storage devices (e.g., photovoltaic or fuel cells), solid-state lighting (e.g., LEDs and OLEDs), magnetic and optical storage devices, micro-electro-mechanical systems (MEMS), and the like.

Figure 1B:
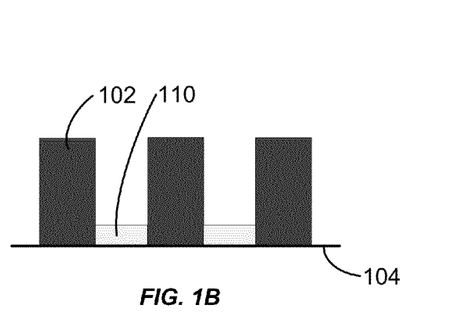

FIG. 1B shows a first silicon-containing film 110 formed between raised features 102. In this example, silicon-containing film 110 may be formed using a flowable CVD process as described more fully below.

Figure 1C:
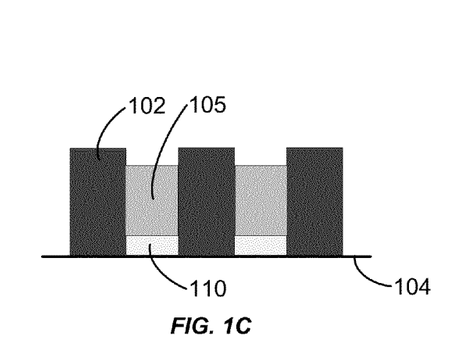

FIG. 1C shows a carbon-containing material 105 formed on top of first silicon-containing film 110. Carbon-containing material 105 may be formed using a flowable chemical vapor deposition (CVD) process as described more fully below. In some embodiments, carbon-containing material 105 may comprise a carbon-doped silicon oxide material including primarily silicon, oxygen, carbon, and hydrogen. In other embodiments, carbon-containing material 105 may comprise a hydrocarbon material. As shown in this figure, carbon-containing material 105 may fill a region between adjacent raised features. When carbon-containing material 105 is formed using a flowable deposition process, the carbon-containing material fills the spaces between the adjacent raised features from the bottom of the trench upward towards the top of the trench. The spaces are filled to a level that is approximately the same across different regions of the substrate regardless of the width or shape of the space between the adjacent raised features in a given region. In some embodiments, the first silicon-containing film 110 may not be used and the carbon-containing material 105 may be deposited on the substrate 104.

Figure 1D:
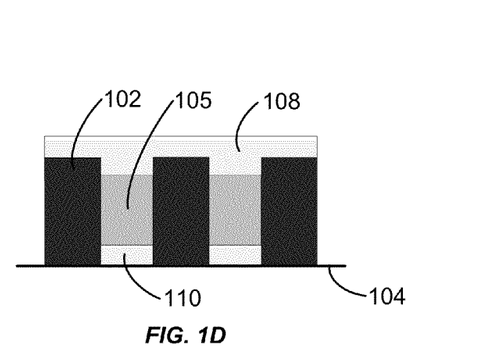

FIG. 1D shows a second silicon-containing film 108 formed over carbon-containing material 105. Second silicon-containing film 108 may be formed using a flowable CVD process as described more fully below. Second silicon-containing film 108 may fill an upper region between raised features 102 and extend over the raised features. In an embodiment, second silicon-containing film 108 includes primarily silicon oxide and is substantially free of carbon. In other embodiments second silicon-containing film 108 is deposited with a different process, such as for example, a non-flowable CVD process or a spin-on process.

Figure 1E:
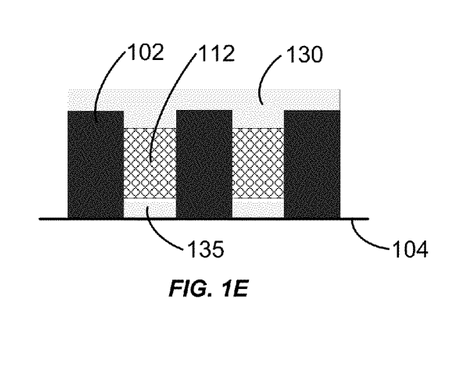

First silicon-containing film 110, carbon-containing material 105 and second silicon-containing film 108 may be exposed to a cure process. As shown in FIGS. 1D and 1E, during the cure process first silicon-containing film 110 may be converted to a first densified oxide 135, and second silicon-containing film 108 may be converted to a second densified oxide 130. In embodiments where the carbon-containing material 105 includes a carbon-doped silicon oxide material, the carbon-containing material may be converted to air gaps 112 including a porous oxide. The porous oxide may primarily include silicon oxide. The pores in the silicon oxide may include a vacuum or gas depending on process conditions of the cure process. In other embodiments where carbon-containing material 105 includes a hydrocarbon material, the hydrocarbon material may be substantially removed leaving air gaps 112 that are primarily voids. Thus, although FIGS. 1E and 1F may illustrate a hydrocarbon material that appears porous, the hydrocarbon material may be substantially removed leaving primarily voids.

The carbon dioxide and water formed during the cure process with the oxygen-containing atmosphere are volatile and diffuse out through second silicon-containing film 108. The oxygen also reacts with silicon in first and second silicon-containing films 110, 108 respectively, to provide silicon oxide (or densified oxide layers 135, 130). In general, the oxygen reacts more quickly with carbon in the carbon-containing material 105 than with silicon in the silicon-containing films 108, 110. This allows the carbon dioxide and water to diffuse out through the second silicon-containing film 108 before or during formation of the densified oxide 130.

The cure process may include exposure to an oxygen-containing atmosphere at an elevated temperature, where the oxygen reacts with carbon in carbon-containing material 105 to provide carbon dioxide and water. Alternatively, the cure process may include exposure to a non-oxidizing atmosphere at an elevated temperature, where the silicon-carbon bonds are thermally cleaved. The elevated temperature may range from about 200° C. to about 1100° C. (e.g., above one of 200° C., 300° C., 400° C., 500° C., 600° C., 700° C., 800° C., 900° C., or 1000° C. in different embodiments). The oxygen-containing atmosphere may include substantially pure oxygen in the form of atomic oxygen (O), molecular oxygen ($O_2$), ozone ($O_3$), and mixtures thereof. The atmosphere may also contain a mixture of oxygen and steam ($H_2O$) and/or oxygen and an inert gas. The non-oxidizing atmosphere may include hydrogen ($H_2$), helium (He), nitrogen ($N_2$), argon (Ar), and/or other non-oxidizing gases. In some embodiments the cure may be performed with a UV-treatment, microwave, e-beam treatment or steam anneal.

As discussed above, in some embodiments, air gaps 112 formed between raised features 102 may comprise one or more pores of a porous oxide created from carbon-doped silicon oxide. A carbon content of the carbon-doped silicon oxide material and conditions of the cure process (e.g., ambient, temperature, pressure, and the like) can be modified to alter a size and concentration of the pores. This in turn alters a dielectric constant of the porous oxide air gaps 112. One of ordinary skill in the art would appreciate that a volume of the porous oxide compared to a volume of the space between the raised features 102 will impact an effective interconnect capacitance of the composite gapfill material (i.e., the densified oxide layers 130, 135 and the porous oxide between the raised features 102). This embodiment provides both a low k material (i.e., the porous oxide) between the raised features 102 and densified oxide 130, 135 between the raised features 102. The densified oxide layers 130, 135 provide structural integrity between raised features 102 and any overlying layers. Densified oxide layers 130, 135 also protect the porous oxide from moisture and other contaminants that the porous oxide might otherwise be exposed to following the cure process. In some embodiments, the vertical location of the air gaps may be controlled by varying the thickness of the densified oxide layers.

As discussed above, in some embodiments where a hydrocarbon is used for carbon-containing material 105, air gaps 112 formed between raised features 102 may comprise primarily voids. One of ordinary skill in the art would appreciate that a volume of the voids compared to a volume of the space between raised features 102 will impact an effective interconnect capacitance of the composite gapfill material (i.e., the densified oxide layers 130, 135 and the voids between the raised features 102). This embodiment provides both a void between the raised features 102 and densified oxide 130, 135 between the raised features 102. The densified oxide layers 130, 135 provide structural integrity between the raised features 102 and any overlying layers. The densified oxide layers 130, 135 also protect the voids from moisture and other contaminants that the voids might otherwise be exposed to following the cure process. In some embodiments, the vertical location of the air gaps may be controlled by varying the thickness of the densified oxide layers.

One of skill in the art will recognize that the thickness (height) of the air gaps may be controlled by controlling the thickness of carbon-containing material 105 and the vertical position may be controlled by controlling the thickness of the first silicon-containing film 110. Thus, some embodiments allow both the thickness (height) of air gap 112 and the vertical position of the airgap to be precisely controlled. In one embodiment, this may be beneficial when the gap formed between adjacent raised structures 102 is narrower at the bottom of the gap than at the top of the gap. More specifically, depositing a relatively thick first silicon-containing film 110 to raise the height of carbon-containing material 105 (and thus airgap 112) means carbon-containing material 105 will span the gap at a location where the width of the gap is wider than at the bottom. Thus, for a given thickness of the carbon-containing material 105 and its resultant air gap 112, the size of the gap between the sidewalls is increased as compared to forming the gap at a lower position in the trench, and this in turn, reduces the dielectric constant of the composite gapfill solution.

Figure 1F:
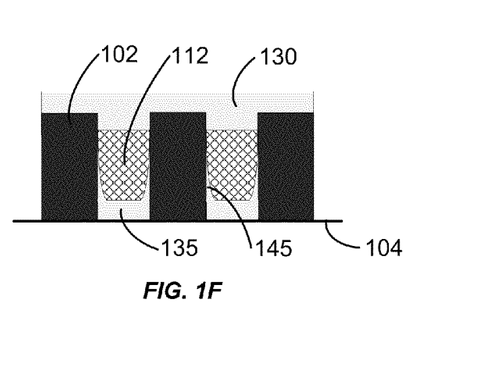

As illustrated in FIG. 1F, in some embodiments, the deposition process used to deposit first silicon-containing film 135 deposits a thin layer of material along the sidewalls 145 of raised features 102. This thin layer of material may extend from the bottom of the trench to the top of the raised features or may extend along just a lower portion of the sidewalls as shown in FIG. 1F. The added material on the sidewalls may provide increased mechanical strength to the stack of materials deposited within the gap between adjacent raised features 102 thus improving the stability of the gap fill scheme and when subjected to subsequent processing.

Figure 2A:
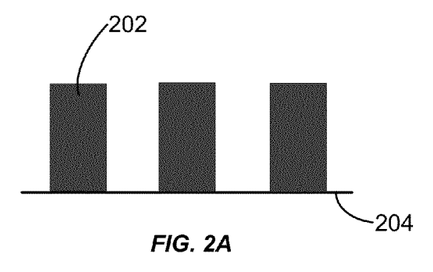
FIGS. 2A-2G are simplified cross-sectional drawings illustrating a method of forming air gaps between adjacent raised features on a substrate according to another embodiment of the invention.

FIGS. 2A-2G are simplified cross-sectional drawings illustrating a method of forming air gaps between adjacent raised features on a substrate according to another embodiment of the invention. FIG. 2A shows raised features 202 on substrate 204. Once again, only a surface of substrate 204 is shown.

Figure 2B:
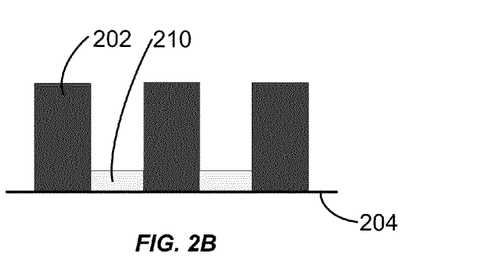

FIG. 2B shows a first silicon-containing film 210 formed between raised features 202.

In this example, silicon-containing film 210 may be formed using a flowable CVD process as described in more detail below.

Figure 2C:
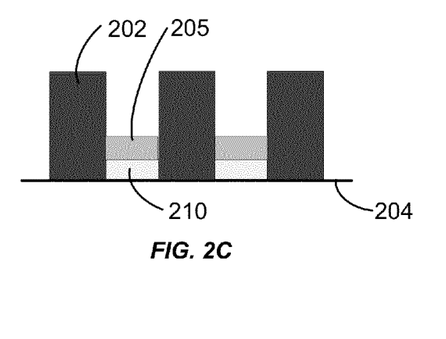

FIG. 2C shows a first carbon-containing material 205 formed on top of first silicon-containing film 210. First carbon-containing material 205 may be formed as discussed in more detail herein using either a carbon-doped silicon oxide material or a hydrocarbon material. As shown in this figure, first carbon-containing material 205 may fill a region between adjacent raised features 202. When first carbon-containing material 205 is formed using a flowable deposition process, first carbon-doped silicon oxide material 205 fills the spaces between adjacent raised features 202 from the bottom of the trench upward towards the top of the trench. The spaces are filled to a level that is approximately the same regardless of the width or shape of the space between adjacent raised features 202. In some embodiments, the first silicon-containing film 210 may not be used and the first carbon-containing material 205 may be deposited on substrate 204.

Figures 2D, 2F:
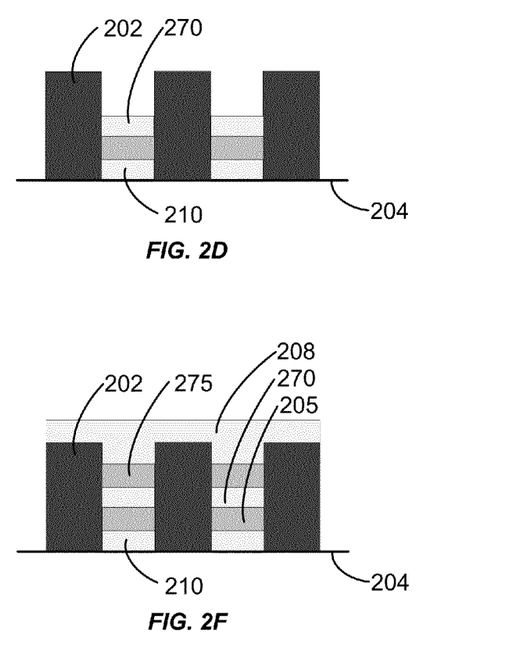

FIG. 2D shows a second silicon-containing film 270 formed between raised features 202 and on top of first carbon-containing material 205. In this example, second silicon-containing film 270 may be formed using a flowable CVD process as described in more detail below.

Figure 2E:
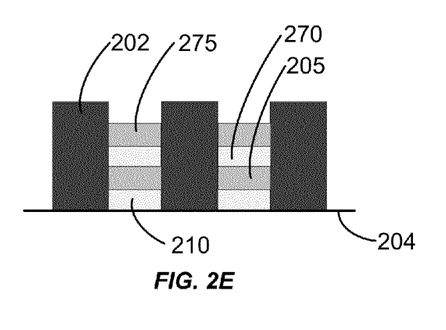

FIG. 2E shows a second carbon-containing material 275 formed on top of second silicon-containing film 270. Second carbon-containing material 275 may be formed as discussed in more detail herein using either a carbon-doped silicon oxide material or a hydrocarbon material. As shown in this figure, second carbon-containing material 275 may fill a region between adjacent raised features 202. When second carbon-containing material 275 is formed using a flowable deposition process, the second carbon-containing material fills the spaces between the adjacent raised features from the bottom of the trench upward towards the top of the trench. The spaces are filled to a level that is approximately the same regardless of the width or shape of the space between the adjacent raised features.

FIG. 2F shows a third silicon-containing film 208 formed over second carbon-containing material 275. Third silicon-containing film 208 may be formed using a flowable CVD process as described more fully below. Third silicon-containing film 208 may fill an upper region between raised features 202 and extend over the raised features. In some embodiments, third silicon-containing film 208 is substantially free of carbon.

In some embodiments, additional carbon-containing layers and silicon-containing films may be deposited to create three, four, or more air gaps. Thus, by reducing the thickness of either or both of the carbon-containing layers and silicon-containing films, more air gaps may be formed in the fixed vertical space.

Figure 2G:
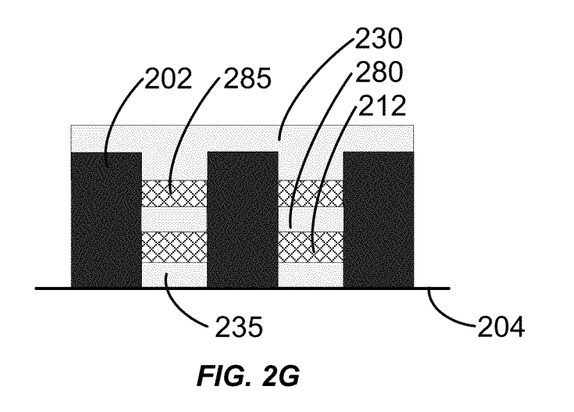

First, second and third silicon-containing films 210, 270 and 208 respectively, and the first and second carbon-containing materials 205, 275 respectively, are exposed to a cure process. As shown in FIGS. 2F and 2G, during the cure process first silicon-containing film 210 may be converted to a first densified oxide 235, second silicon-containing film 270 may be converted to a second densified oxide 280, and third silicon-containing film 208 may be converted to a third densified oxide 230. Further, first carbon-containing material 205 may be converted to a first air gap 212 and second carbon-containing material 275 may be converted to a second air gap 285. Thus, although FIG. 2G may illustrate a hydrocarbon material that appears porous, the hydrocarbon material may be substantially removed leaving primarily voids.

The carbon dioxide and water formed during the cure process with the oxygen-containing atmosphere are volatile and diffuse out through second silicon-containing film 270 and third silicon-containing film 208. The oxygen also reacts with silicon contained in the first, second and third silicon-containing films 210, 270, 208 respectively, to provide silicon oxide (or densified oxide layers 235, 280, 230). In general, the oxygen reacts more quickly with carbon in the carbon-containing materials 205, 275 than with silicon in the silicon-containing films 210, 270, 208. This allows the carbon dioxide and water to diffuse out through the second and third silicon-containing films 270, 208 respectively, before or during formation of the second and third densified oxide layers 280, 230 respectively.

The cure process may include exposure to an oxygen-containing atmosphere at an elevated temperature, where the oxygen reacts with carbon in carbon-containing materials 205, 275 to provide carbon dioxide and water. Alternatively, the cure process may include exposure to a non-oxidizing atmosphere at an elevated temperature, where the silicon-carbon bonds are thermally cleaved. The elevated temperature may range from about 200° C. to about 1100° C. (e.g., above one of 200° C., 300° C., 400° C., 500° C., 600° C., 700° C., 800° C., 900° C., or 1000° C. in different embodiments). The oxygen-containing atmosphere may include substantially pure oxygen in the form of atomic oxygen (O), molecular oxygen ($O_2$), ozone ($O_3$), and mixtures thereof. The atmosphere may also contain a mixture of oxygen and steam ($H_2O$) and/or oxygen and an inert gas. The non-oxidizing atmosphere may include hydrogen ($H_2$), helium (He), nitrogen ($N_2$), argon (Ar), and/or other non-oxidizing gases. In some embodiments the cure may be performed with a UV-treatment, e-beam, microwave treatment or steam anneal.

As discussed above, in some embodiments, air gaps 212, 285 formed between raised features 202 may comprise one or more pores of a porous oxide created from carbon-doped silicon oxide. A carbon content of the carbon-doped silicon oxide material and conditions of the cure process (e.g., ambient, temperature, pressure, and the like) can be modified to alter a size and concentration of the pores. This in turn alters a dielectric constant of the porous oxide air gaps 212, 285. One of ordinary skill in the art would appreciate that a volume of the porous oxide compared to a volume of the space between raised features 202 will impact an effective interconnect capacitance of the composite gapfill material (i.e., the densified oxide layers 235, 280, 230 and the porous oxide between raised features 202). This embodiment provides both a low k material (i.e., the porous oxide) between raised features 202 and densified oxide 235, 280, 230 between the raised features 202. Densified oxide layers 235, 280, 230 provide structural integrity between raised features 202 and any overlying layers. Densified oxide layers 235, 280, 230 also protect the porous oxide from moisture and other contaminants that the porous oxide might otherwise be exposed to following the cure process. In some embodiments, the vertical location of the air gaps may be controlled by varying the thickness of the densified oxide layers.

As discussed above, in some embodiments where a hydrocarbon is used for carbon-containing materials 205, 275 air gaps 212, 285 formed between raised features 202 may comprise primarily voids. One of ordinary skill in the art would appreciate that a volume of the voids compared to a volume of the space between raised features 202 will impact an effective interconnect capacitance of the composite gapfill material (i.e., the densified oxide layers 235, 280, 230 and the voids between the raised features 202). This embodiment provides both a void between the raised features 202 and densified oxide 235, 280, 230 between the raised features 202. Densified oxide layers 235, 280, 230 provide structural integrity between raised features 202 and any overlying layers. Densified oxide layers 235, 280, 230 also protect the voids from moisture and other contaminants that the voids might otherwise be exposed to following the cure process. In some embodiments, the vertical location of the air gaps may be controlled by varying the thickness of the densified oxide layers.

One of skill in the art will recognize that the thickness (height) of the air gaps may be controlled by controlling the thickness of carbon-containing material 205, 275 and the vertical position may be controlled by controlling the thickness of the first silicon containing film 210. One will also recognize that the number of air gaps can be controlled by varying the number of layers deposited. Thus, some embodiments allow the thickness (height) of air gaps 212, 285, the vertical position of the air gaps and the number of air gaps to be precisely controlled. In one embodiment, this may be beneficial when the gap formed between adjacent raised structures 202 is narrower at the bottom of the gap than at the top of the gap. More specifically, depositing a relatively thick first silicon-containing film 210 to raise the height of carbon-containing materials 205, 275 (and thus airgaps 212, 285) means carbon-containing materials 205, 275 will span the gap at a location where the width of the gap is wider than at the bottom. Thus, for a given thickness of the carbon-containing materials 205, 275 and their resultant air gaps 212, 285, the size of the gap between the sidewalls is increased as compared to forming the gap lower down in the trench, and this in turn, reduces the dielectric constant of the composite gapfill solution.

In some embodiments, the deposition process may be used to deposit the first silicon-containing film 210 (see FIG. 1F for reference) along the sidewalls of raised features 202. This thin layer of material may extend from the bottom of the trench to the top of the raised features or may extend along just a lower portion of the sidewalls (see FIG. 1F for reference). The added material on the sidewalls may provide increased mechanical strength to the stack of materials deposited within the gap between adjacent raised features thus improving the stability of the gap fill scheme and when subjected to subsequent processing.

Figure 3A:
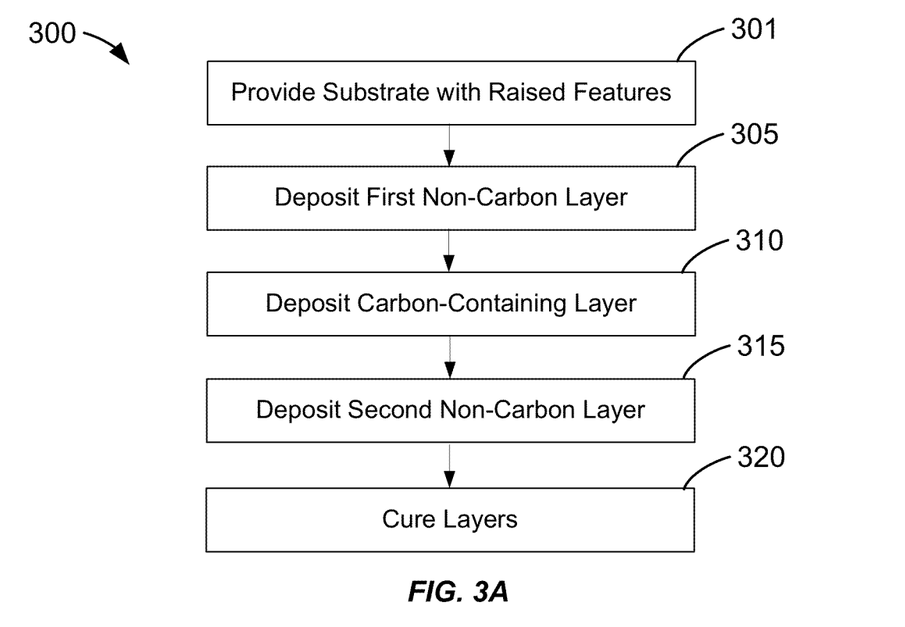
FIGS. 3A-3B are methods of forming air gaps between adjacent raised features on a substrate according to embodiments of the invention.

FIG. 3A describes a process 300 for manufacturing an embodiment that forms air gaps between raised features on a substrate. In step 301 a substrate with raised features is provided. The raised features may be metal lines on a surface of the substrate, conductive lines overlaying devices formed in or on the substrate, trenches formed in an upper portion of the substrate, or the like.

In step 305 a first layer of non-carbon material is deposited between the raised features. In some embodiments the first layer of non-carbon material is a silicon-containing film that may be formed using a flowable CVD process as described more fully below. In an embodiment, the silicon-containing film includes primarily silicon oxide and is substantially free of carbon. In other embodiments the silicon-containing film is deposited with a different process, such as for example, a non-flowable CVD process or a spin-on process.

In step 310 a carbon-containing layer is deposited on top of the first layer of non-carbon material. In some embodiments the carbon-containing layer is a carbon-doped silicon oxide material. The carbon-doped silicon oxide material may be formed using a flowable chemical vapor deposition (CVD) process as described more fully below. The carbon-doped silicon oxide material may include primarily silicon, oxygen, carbon, and hydrogen. In other embodiments, the carbon-containing layer comprises doped silicon oxide materials. In further embodiments, the carbon-containing layer may comprise a hydrocarbon material deposited using a flowable CVD process similar to the carbon-doped silicon oxide material. In further embodiments, the hydrocarbon material may be formed using a conventional spin-on, hot-wire CVD or alternative deposition process. The hydrocarbon material may include primarily carbon and hydrogen. In some embodiments, the first silicon-containing film may not be used and the first carbon-containing material may be deposited on the substrate.

In step 315 a second non-carbon layer is deposited on top of the carbon-containing layer. In some embodiments the second layer of non-carbon material is a silicon-containing film that may be formed using a flowable CVD process as described more fully below. In an embodiment, the silicon-containing film includes primarily silicon oxide and is substantially free of carbon. In other embodiments the silicon-containing film is deposited with a different process, such as for example, a non-flowable CVD process or a spin-on process. The second non-carbon layer may fill an upper region between the raised features and extend over the raised features.

In step 320 the substrate with raised features, including the non-carbon and carbon-containing layers, is exposed to a cure process. In some embodiments the cure process converts the non-carbon layers to densified oxide layers. In further embodiments where the carbon-containing material comprises a carbon-doped silicon oxide material, the cure process converts the carbon-containing layers to air gaps including a porous oxide and extending between the raised features. In other embodiments, where the carbon-containing material comprises a hydrocarbon, the cure converts the carbon-containing layer to air gaps that are substantially voids extending between the raised features. The air gaps may comprise a vacuum or gas depending on process conditions of the cure process.

Figure 3B:
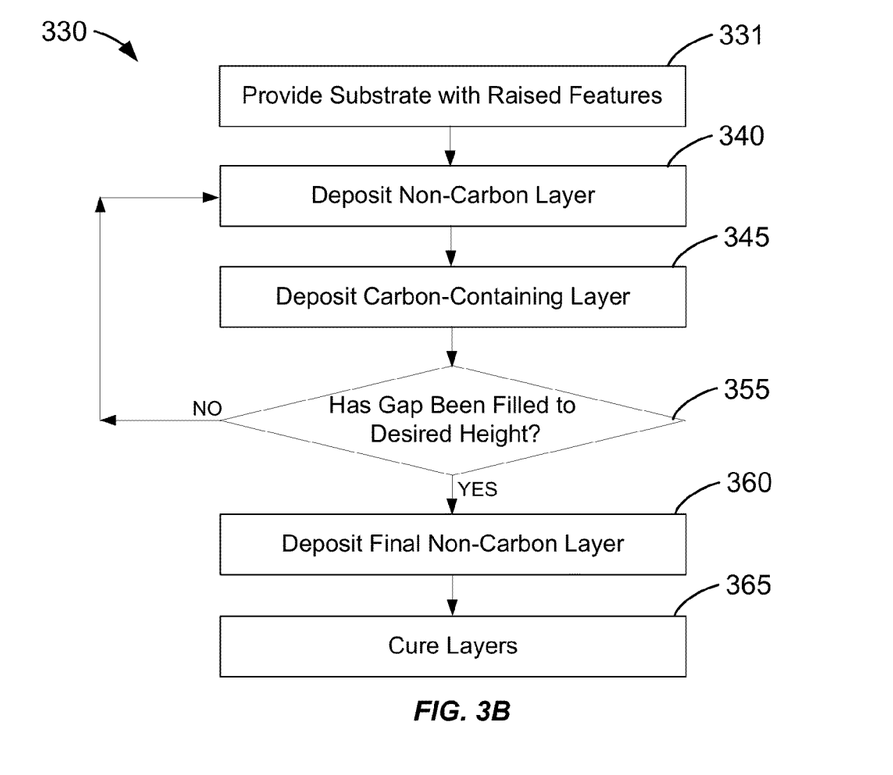

FIG. 3B describes a process 330 for manufacturing an embodiment that forms air gaps between raised features on a substrate. In step 331 a substrate with raised features is provided. The raised features may be metal lines on a surface of the substrate, conductive lines overlaying devices formed in or on the substrate, trenches formed in an upper portion of the substrate, or the like.

In step 340 a layer of non-carbon material is deposited in the gap between the raised features. In some embodiments the layer of non-carbon material is a silicon-containing film that may be formed using a flowable CVD process as described more fully below. In an embodiment, the silicon-containing film includes primarily silicon oxide and is substantially free of carbon. In other embodiments the silicon-containing film is deposited with a different process, such as for example, a non-flowable CVD process or a spin-on process.

In step 345 a carbon-containing layer is deposited on top of the first layer of non-carbon material. In some embodiments the carbon-containing layer is a carbon-doped silicon oxide material. The carbon-doped silicon oxide material may be formed using a flowable chemical vapor deposition (CVD) process as described more fully below. The carbon-doped silicon oxide material may include primarily silicon, oxygen, carbon, and hydrogen. In other embodiments, the carbon-containing layer comprises doped silicon oxide materials. In further embodiments, the carbon-containing layer may comprise a hydrocarbon material deposited using a flowable CVD process similar to the carbon-doped silicon oxide material. In further embodiments, the hydrocarbon material may be formed using a conventional spin-on, hot-wire CVD or alternative deposition process. The hydrocarbon material may include primarily carbon and hydrogen. In some embodiments, the first silicon-containing film may not be used and the first carbon-containing material may be deposited on the substrate.

In step 355 a decision is made. If the gap between the raised features has been filled to the desired height, the process proceeds to step 360. However, if the gap has not been filled to the desired height, the process returns to step 340 where an additional non-carbon layer is deposited. The process then proceeds to step 345 where an additional carbon-containing layer is deposited. The process may repeat as many times as necessary until the gap between the raised features is filled to the desired height.

In step 360 a final non-carbon layer is deposited on top of the last carbon-containing layer. In some embodiments the final layer of non-carbon material is a silicon-containing film that may be formed using a flowable CVD process as described more fully below. In an embodiment, the silicon-containing film includes primarily silicon oxide and is substantially free of carbon. In other embodiments the silicon-containing film is deposited with a different process, such as for example, a non-flowable CVD process or a spin-on process. The final non-carbon layer may fill an upper region between the raised features and extend over the raised features.

In step 365 the substrate with raised features, including the non-carbon and carbon-containing layers, is exposed to a cure process. In some embodiments the cure process converts the non-carbon layers to densified oxide layers. In further embodiments where the carbon-containing materials comprise a carbon-doped silicon oxide material, the cure process converts the carbon-containing layers to air gaps including a porous oxide and extending between the raised features. In other embodiments, where the carbon-containing materials comprise a hydrocarbon, the cure converts the carbon-containing layers to air gaps that are substantially voids extending between the raised features. The air gaps may comprise a vacuum or gas depending on process conditions of the cure process.

Flowable Carbon-Doped Silicon Oxide Formation

In some embodiments, the carbon-containing layer may be a carbon-doped silicon oxide film. An exemplary method of forming a flowable carbon-doped silicon oxide film includes providing a silicon precursor to a reaction chamber. The silicon precursor may include one or more carbon-containing organo-silicon compounds. The silicon precursor may also include a non-carbon containing silicon compound such as silane ($SiH_4$). The organo-silicon containing compounds may include those with direct Si—C bonding and/or those with Si—O—C bonding. Examples of organosilane silicon precursors include dimethylsilane, trimethylsilane, tetramethylsilane, diethylsilane, tetramethylorthosilicate (TMOS), tetraethylorthosilicate (TEOS), octamethyltrisiloxane (OMTS), octamethylcyclotetrasiloxane (OMCTS), tetramethylcyclotetrasiloxane (TOMCATS), DMDMOS, DEMS, methyl triethoxysilane (MTES), phenyldimethylsilane, and phenylsilane, and mixtures thereof, among others.

In some embodiments, a flowable oxide or a flowable low-k material can be used as the silicon-containing films.

The organo-silicon precursor may be mixed with a carrier gas before or during its introduction to the deposition chamber. A carrier gas may be an inactive gas that does not unduly interfere with the formation of the oxide film on the substrate. Examples of carrier gases include helium, hydrogen, neon, argon, and nitrogen, among other gases.

An oxygen-containing precursor may also be introduced to the substrate containing reaction chamber. The oxygen containing precursor may include atomic oxygen remotely generated outside the deposition chamber. The atomic oxygen may be generated by the dissociation of a precursor such as molecular oxygen ($O_2$), ozone ($O_3$), a nitrogen-oxygen compound (e.g., NO, $NO_2$, $N_2O$, etc.), a hydrogen-oxygen compound (e.g., $H_2O$, $H_2O_2$, etc.), a carbon-oxygen compound (e.g., CO, $CO_2$, etc.), as well as other oxygen containing precursors and combinations of precursors.

The dissociation of the precursor to generate the atomic oxygen may also be done by thermal dissociation, ultraviolet light dissociation, and/or plasma dissociation, among other methods. Plasma dissociation may involve striking a plasma from helium, argon, etc., in a remote plasma generating chamber and introducing the oxygen precursor to the plasma to generate the atomic oxygen precursor.

In some embodiments, the atomic oxygen and organosilicon precursors are not mixed before being introduced to the deposition chamber. The precursors may enter the chamber through spatially separated precursor inlets distributed around reaction chamber. For example, the atomic oxygen precursor may enter from an inlet (or inlets) at the top of the chamber and positioned directly above the substrate. The inlet(s) may direct the flow of the oxygen precursor in a direction perpendicular to the substrate deposition surface. Meanwhile, the silicon precursor may enter from one or more inlets around the sides of the deposition chamber. The inlets may direct the flow of the silicon precursor in a direction approximately parallel to the deposition surface.

Additional embodiments include introducing the atomic oxygen and silicon precursors through separate ports of a multi-port showerhead. For example, a showerhead positioned above the substrate may include a pattern of openings for the precursors to enter the deposition chamber. One subset of openings may be supplied for the atomic oxygen precursor, while a second subset of openings may be supplied for the silicon precursor. Precursors traveling through different sets of opening may be fluidly isolated from each other until exiting into the deposition chamber.

As the atomic oxygen and silicon precursors react in the deposition chamber, they form carbon-doped silicon oxide on the substrate deposition surface. During the initial deposition, the substrate may be held a constant and relatively low temperature (e.g., about 30° C. to about 70° C.). The initial oxide layer has excellent flowability, and can quickly migrate to the bottoms of the gaps in the structures on the substrate surface.

Hydrocarbon Material

In some embodiments, the carbon-containing layer may be a hydrocarbon material. The hydrocarbon material may be formed using a flowable CVD process similar to the carbon-doped silicon oxide material discussed above. Alternatively, the hydrocarbon material may be formed using a conventional spin-on deposition process, a hot-wire CVD process, plasma-enhanced CVD or any other suitable deposition process.

The hydrocarbon material comprises primarily carbon and hydrogen. In some embodiments the hydrocarbon material is an oligomer, while in further embodiments the hydrocarbon material may be a polymer.

In embodiments that deposit the hydrocarbon with a hot-wire CVD process, deposition may be performed using vinyl monomer precursors that been developed to obtain complete, void free gapfill of high aspect ratio patterned line and space structures. The monomers are polymerized on the substrate surface by reacting them with a thermally activated organic peroxide initiator. In further embodiments, two monomers including N,N-dimethylacrylamide and divinylbenzene may be used for "bottom up" coating rather than conformal coating. In some embodiments a complete void free gap fill may be achieved by tuning the process conditions such as pressure, wire temperature, and precursor flow rates. In other embodiments, polydivinybenzene (pDVB) and polydimethylacrylamide (pDMA) films may be formed.

In some embodiments, the coating process can take place at a range of pressures from 100 mTorr to about 800 Torr. In further embodiments, the flow rates of the monomer and initiator may be adjusted (0.5 SCCM to 5000 SCCM). In other embodiments, the temperature of the filament may range from 100° C. to 800° C. In further embodiments, the coating process can take place at pedestal temperatures from 10° C. to 100° C. In still further embodiments, the rate of polymer deposition may be from 10 Å/min to 10000 Å/min via process tuning. In other embodiments, an auxiliary gas may be used with the monomer source gases to facilitate the growth process. The auxiliary gas may comprise one or more gases, such as carrier gases, inert gases, reducing gases.

In some embodiments, the gaseous initiator of the hydrocarbon material may be selected from the group including hydrogen peroxide, alkyl peroxides, aryl peroxides, hydroperoxides, halogens and nonoxidizing initiators, such as tert-butyl peroxide, tert-amyl peroxide. In further embodiments, the monomer precursor may be selected from vinyl containing precursors such as acrylate, methacrylate, vinylbenzene.

Flowable Silicon-Containing Formation

In some embodiments, the silicon-containing film may be a flowable silicon-containing material. An exemplary method of forming a flowable silicon-containing film includes providing a carbon-free silicon precursor to a reaction chamber. The carbon-free silicon precursor may be, for example, a silicon-and-nitrogen precursor, a silicon-and-hydrogen precursor, or a silicon-nitrogen-and-hydrogen containing precursor, among other classes of silicon precursors. Specific examples of these precursors may include silyl-amines such as $H_2N(SiH_3)$, $HN(SiH_3)_2$, and $N(SiH_3)_3$, among other silyl-amines. These silyl-amines may be mixed with additional gases that may act as carrier gases, reactive gases, or both. Examples of additional gases may include hydrogen, nitrogen, ammonia, helium, argon, among other gases. Examples of carbon-free silicon precursors may also include silane ($SiH_4$) either alone or mixed with other silicon-containing gases (e.g., $N(SiH_3)_3$), hydrogen-containing gases (e.g., $H_2$), and/or nitrogen-containing gases (e.g., $N_2$, $NH_3$). Carbon-free silicon precursors may also include disilane, trisilane, higher-order silanes, and chlorinated silanes, alone or in combination with one another or the previously mentioned carbon-free silicon precursors.

The silicon-precursor may be oxygen-free in addition to carbon-free. The lack of oxygen results in a lower concentration of silanol (Si—OH) groups in the silicon-and-nitrogen layer formed from the precursors. Excess silanol moieties in the deposited film can cause increased porosity and shrinkage during post deposition steps that remove the hydroxyl (—OH) moieties from the deposited layer.

A radical-nitrogen precursor is also provided to the reaction chamber. The radical-nitrogen precursor is a nitrogen-radical containing species generated outside the reaction chamber from a more stable nitrogen precursor. For example, a relatively stable nitrogen precursor such a $NH_3$ and/or hydrazine ($N_2H_4$) may be activated in a plasma unit outside the reaction chamber to form the radical-nitrogen precursor, which is then transported into the reaction chamber. The stable nitrogen precursor may also be a mixture including $NH_3$ & $N_2$, $NH_3$ & $H_2$, $NH_3$ & $N_2$ & $H_2$, and $N_2$ & $H_2$, in different embodiments. Hydrazine may also be used in place of or in combination with $NH_3$ in the mixtures with $N_2$ and $H_2$. The radical-nitrogen precursor produced may be one or more of .N, .NH, .$NH_2$, etc., and may also be accompanied by ionized species formed in the plasma.

A radical precursor may be a radical-nitrogen precursor if it includes nitrogen supplied with the aforementioned precursors to the remote plasma region. Generally speaking, a radical precursor which does not include nitrogen will also allow a silicon-and-nitrogen-containing layer to be formed. The radical precursor is generated in a section of the reaction chamber partitioned from a deposition region where the precursors mix and react to deposit the silicon-and-nitrogen layer on a deposition substrate (e.g., a semiconductor wafer). In an embodiment where the radical precursor is a radical-nitrogen precursor, a stable nitrogen precursor is flowed into the remote plasma region and excited by a plasma. The stable nitrogen precursor (and the radical-nitrogen precursor) may also be accompanied by a carrier gas such as hydrogen, nitrogen, argon, helium, etc. A radical-nitrogen precursor formed from an input gas consisting essentially of nitrogen ($N_2$) (with or without additional inert carrier gases) has also been found to produce beneficial films. The radical-nitrogen precursor may also be replaced by a radical precursor formed from an input gas consisting essentially of hydrogen ($H_2$) (and optionally inert carrier gases) in embodiments where the silicon-containing precursor comprises nitrogen.

In the reaction chamber, the carbon-free silicon precursor and the radical-nitrogen precursor mix and react to deposit a silicon-and-nitrogen containing film on the deposition substrate. The deposited silicon-and-nitrogen containing film has flowable characteristics unlike conventional silicon nitride ($Si_3N_4$) film deposition techniques. The flowable nature of the formation allows the film to flow into narrow gaps and/or trenches and other structures on the deposition surface of the substrate.

The flowability may be due to a variety of properties which result from mixing a radical-nitrogen precursors with carbon-free silicon precursor. These properties may include a significant hydrogen component in the deposited film and/or the presence of short chained polysilazane polymers. These short chains grow and network to form more dense dielectric material during and after the formation of the film. For example, the deposited film may have a silazane-type, Si—NH—Si backbone (i.e., a Si—N—H film). When both the silicon precursor and the radical-nitrogen precursor are carbon-free, the deposited silicon-and-nitrogen containing film is also substantially carbon-free. Of course, "carbon-free" does not necessarily mean the film lacks even trace amounts of carbon. Carbon contaminants may be present in the precursor materials that find their way into the deposited silicon-and-nitrogen precursor. The amount of these carbon impurities however is much less than would be found in a silicon precursor having a carbon moiety (e.g., TEOS, TMDSO, etc.).

The chamber plasma region or a region in an remote plasma system may be referred to as a remote plasma region. In some embodiments, the radical-nitrogen precursor is created in the remote plasma region and travels into the substrate processing region where the carbon-free silicon-containing precursor is excited by the radical-nitrogen precursor. In some embodiments, the carbon-free silicon-containing precursor is excited only by the radical-nitrogen precursor. Plasma power may essentially be applied only to the remote plasma region to ensure that the radical-nitrogen precursor provides the dominant excitation to the carbon-free silicon-containing precursor.

In embodiments employing a chamber plasma region, the excited plasma effluents are generated in a section of the substrate processing region partitioned from a deposition region. The deposition region, also known herein as the substrate processing region, is where the plasma effluents mix and react with the carbon-free silicon-containing precursor to deposit the silicon-and-nitrogen layer on a deposition substrate. The excited plasma effluents are also accompanied by an inert gases. The carbon-free silicon-containing precursor does not pass through a plasma before entering the substrate plasma region, in some embodiments. The substrate processing region may be described herein as "plasma-free" during the growth of the silicon-and-nitrogen-containing layer. "Plasma-free" does not necessarily mean the region is devoid of plasma. Ionized species and free electrons created within the plasma region do travel through apertures in the showerhead. The borders of the plasma in the chamber plasma region are hard to define and may encroach upon the substrate processing region through the apertures in the showerhead. In the case of an inductively-coupled plasma, a small amount of ionization may be effected within the substrate processing region directly. Furthermore, a low intensity plasma may be created in the substrate processing region without eliminating desirable features of the forming film.

Exemplary Deposition System

Processing chambers that may be used to deposit flowable layers in accordance with embodiments of the present invention may include high-density plasma chemical vapor deposition (HDP-CVD) chambers, plasma enhanced chemical vapor deposition (PECVD) chambers, sub-atmospheric chemical vapor deposition (SACVD) chambers, and thermal chemical vapor deposition chambers, among other types of chambers. Specific examples include the CENTURA ULTIMA® HDP-CVD chambers/systems, and PRODUCER® PECVD chambers/systems, available from Applied Materials, Inc. of Santa Clara, Calif.

Figure 4:
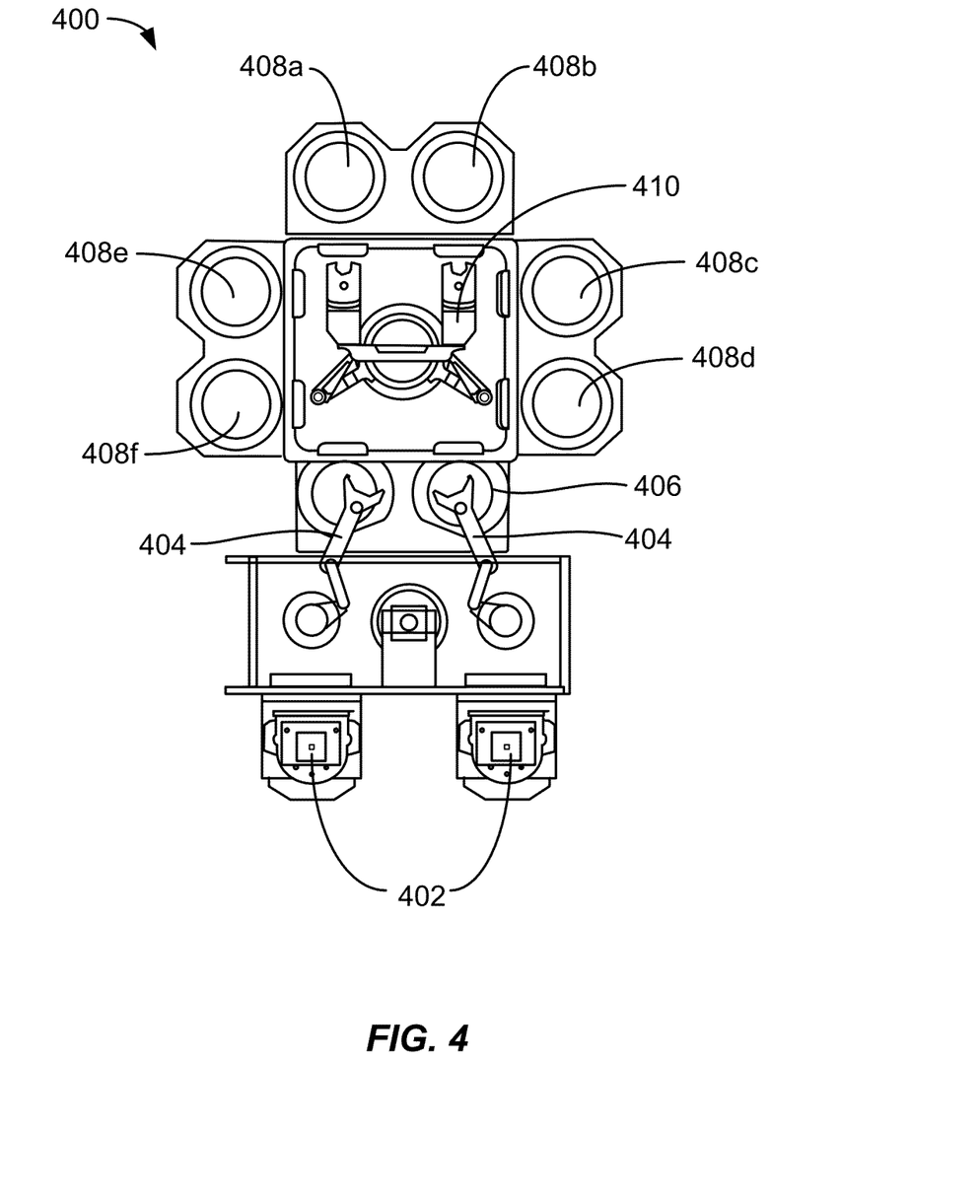
FIG. 4 is a simplified diagram of a substrate processing system that may be used to form air gaps between adjacent raised features according to embodiments of the invention.

The processing chambers may be incorporated into larger fabrication systems for producing integrated circuit chips. FIG. 4 shows one such system 400 of deposition, baking, and curing chambers. In the figure, a pair of FOUPs (front opening unified pods) 402 supply, substrates (e.g., 300 mm diameter wafers) that are received by robotic arms 404 and placed into a low pressure holding area 406 before being placed into one of the wafer processing chambers 408a-f. A second robotic arm 410 may be used to transport the substrate wafers from the holding area 406 to the processing chambers 408a-f and back.

The processing chambers 408a-f may include one or more system components for depositing, annealing, curing, and/or etching a flowable dielectric film on the substrate wafer. In one configuration, two pairs of the processing chamber (e.g., 408c-d and 408e-f) may be used to deposit the flowable dielectric material on the substrate, and the third pair of processing chambers (e.g., 408a-b) may be used to anneal the deposited dielectric. In another configuration, the same two pairs of processing chambers (e.g., 408c-d and 408e-f) may be configured to both deposit and anneal a flowable dielectric film on the substrate, while the third pair of chambers (e.g., 408a-b) may be used for UV or E-beam curing of the deposited film. In still another configuration, all three pairs of chambers (e.g., 408a-f) may be configured to deposit and cure a flowable dielectric film on the substrate. In yet another configuration, two pairs of processing chambers (e.g., 408c-d and 408e-f) may be used for both deposition and UV or E-beam curing of the flowable dielectric, while a third pair of processing chambers (e.g. 408a-b) may be used for annealing the dielectric film. Any one or more of the processes described may be carried out on chamber(s) separated from the fabrication system shown in different embodiments.

In addition, one or more of the process chambers 408a-f may be configured as a wet treatment chamber. These process chambers include heating the flowable dielectric film in an atmosphere that includes moisture. Thus, embodiments of system 400 may include wet treatment chambers 408a-b and anneal processing chambers 408c-d to perform both wet and dry anneals on the deposited dielectric film.

Figure 5A:
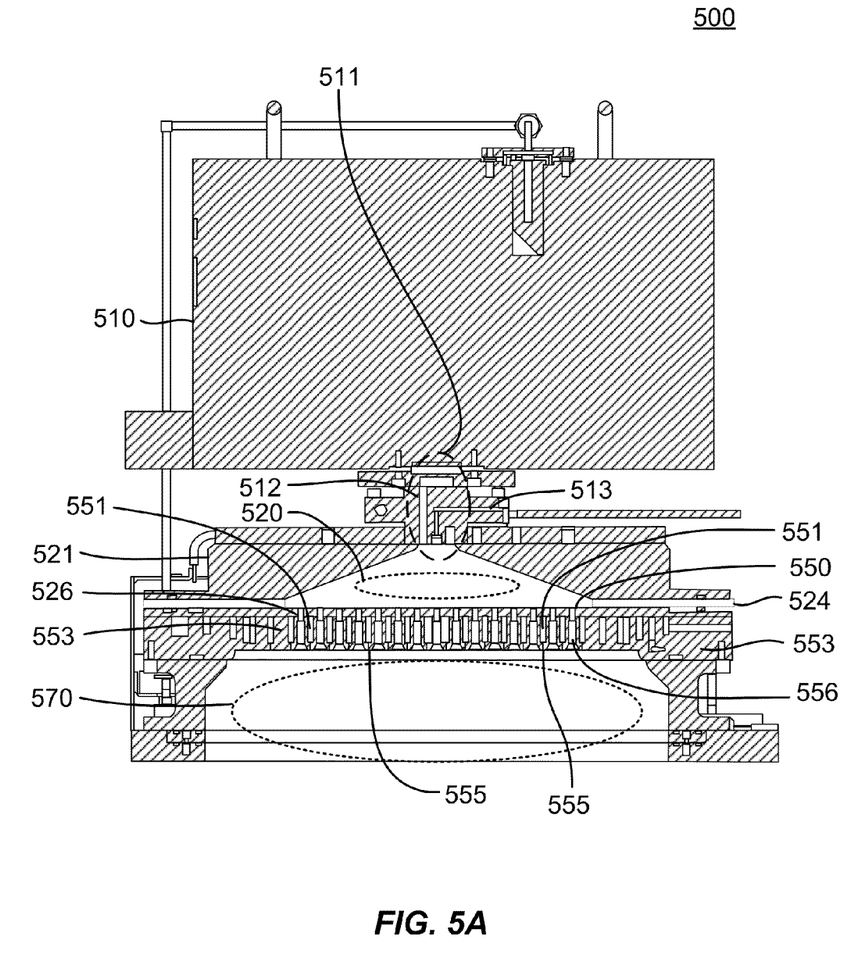
FIG. 5A is a simplified diagram of a substrate processing chamber that may be used to form air gaps between adjacent raised features according to embodiments of the invention.

FIG. 5A is a simplified diagram of an exemplary substrate processing chamber 500. A remote plasma system (RPS) 510 may process a gas which then travels through a gas inlet assembly 511. Two distinct gas supply channels are visible within the gas inlet assembly 511. A first channel 512 carries a gas that passes through the RPS 510, while a second channel 513 bypasses the RPS 510. First channel 512 may be used for the process gas and second channel 513 may be used for a treatment gas in disclosed embodiments. The lid (or conductive top portion) 521 and a perforated partition 553 are shown with an insulating ring 524 in between, which allows an AC potential to be applied to the lid 521 relative to perforated partition 553. The process gas travels through first channel 512 into chamber plasma region 520 and may be excited by a plasma in chamber plasma region 520 alone or in combination with RPS 510. The combination of chamber plasma region 520 and/or RPS 510 may be referred to as a remote plasma system herein. The perforated partition (also referred to as a showerhead) 553 separates chamber plasma region 520 from a substrate processing region 570 beneath showerhead 553. Showerhead 553 allows a plasma present in chamber plasma region 520 to avoid directly exciting gases in substrate processing region 570, while still allowing excited species to travel from chamber plasma region 520 into substrate processing region 570.

Showerhead 553 is positioned between chamber plasma region 520 and substrate processing region 570 and allows plasma effluents (excited derivatives of precursors or other gases) created within chamber plasma region 520 to pass through a plurality of through holes 556 that traverse the thickness of the plate. The showerhead 553 also has one or more hollow volumes 551 which can be filled with a precursor in the form of a vapor or gas (such as a silicon-containing precursor) and pass through small holes 555 into substrate processing region 570 but not directly into chamber plasma region 520. Showerhead 553 is thicker than the length of the smallest diameter 550 of the through-holes 556 in this example. In order to maintain a significant concentration of excited species penetrating from chamber plasma region 520 to substrate processing region 570, the length 526 of the smallest diameter 550 of the through-holes may be restricted by forming larger diameter portions of through-holes 556 part way through the showerhead 553. The length of the smallest diameter 550 of the through-holes 556 may be the same order of magnitude as the smallest diameter of the through-holes 556 or less in this example.

In the example shown, showerhead 553 may distribute (via through holes 556) process gases which contain oxygen, hydrogen, nitrogen, and/or plasma effluents of such process gases upon excitation by a plasma in chamber plasma region 520. In some embodiments, the process gas introduced into the RPS 510 and/or chamber plasma region 520 through first channel 512 may contain one or more of oxygen ($O_2$), ozone ($O_3$), $N_2O$, NO, $NO_2$, $NH_3$, $N_xH_y$ including $N_2H_4$, silane, disilane, TSA and DSA. The process gas may also include a carrier gas such as helium, argon, nitrogen ($N_2$), etc. The second channel 513 may also deliver a process gas, a carrier gas, and/or a film-curing gas used to remove an unwanted component from the growing or as-deposited film. Plasma effluents may include ionized or neutral derivatives of the process gas and may also be referred to herein as a radical-oxygen precursors and/or a radical-nitrogen precursor referring to the atomic constituents of the process gas introduced.

In embodiments, the number of through-holes 556 may be between about 60 and about 2000. Through-holes 556 may have a variety of shapes but are most easily made round. The smallest diameter 550 of through holes 556 may be between about 0.5 mm and about 20 mm or between about 1 mm and about 6 mm in this example. There is also latitude in choosing the cross-sectional shape of through-holes, which may be made conical, cylindrical or a combination of the two shapes. The number of small holes 555 used to introduce a gas into substrate processing region 570 may be between about 100 and about 5000 or between about 500 and about 2000 in different embodiments. The diameter of the small holes 555 may be between about 0.1 mm and about 2 mm.

Figure 5B:
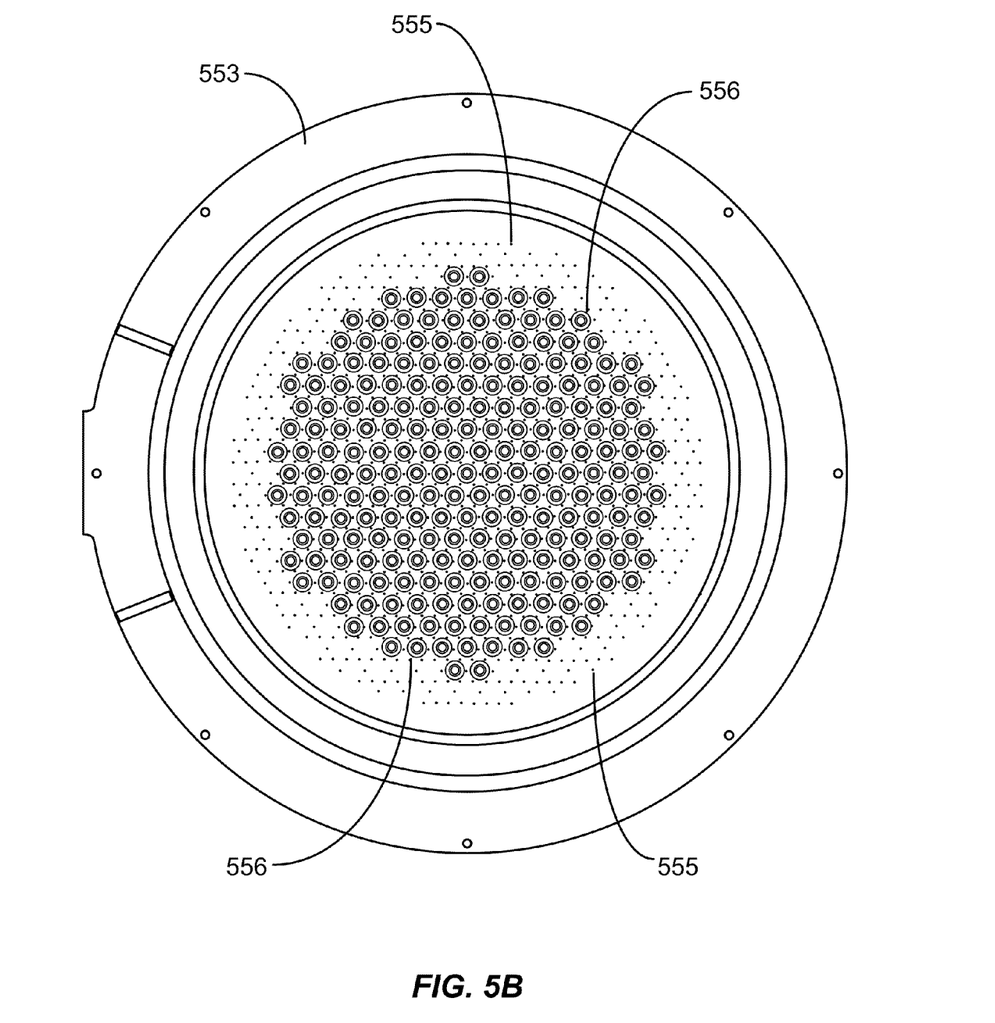
FIG. 5B is a simplified diagram of a showerhead that may be used in a substrate processing chamber to form air gaps between adjacent raised features according to embodiments of the invention.

FIG. 5B is a simplified bottom view of an exemplary showerhead 553. Showerhead 553 corresponds with the showerhead shown in FIG. 5A. Through-holes 556 are depicted with a larger inner-diameter (ID) on the bottom of showerhead 553 and a smaller ID at the top. Small holes 555 are distributed substantially evenly over the surface of the showerhead, even amongst the through-holes 556 which helps to provide more even mixing than other embodiments described herein.

An exemplary film is created on a substrate supported by a pedestal (not shown) within substrate processing region 570 when plasma effluents arriving through through-holes 556 in showerhead 553 combine with a silicon-containing precursor arriving through the small holes 555 originating from hollow volumes 551. Though substrate processing region 570 may be equipped to support a plasma for other processes such as curing, no plasma is present during the growth of the exemplary film.

A plasma may be ignited either in chamber plasma region 520 above showerhead 553 or substrate processing region 570 below showerhead 553. A plasma is present in chamber plasma region 520 to produce the radical-nitrogen precursor from an inflow of a nitrogen-and-hydrogen-containing gas. An AC voltage typically in the radio frequency (RF) range is applied between the conductive top portion 521 of the processing chamber and showerhead 553 to ignite a plasma in chamber plasma region 520 during deposition. An RF power supply generates a high RF frequency of 13.56 MHz but may also generate other frequencies alone or in combination with the 13.56 MHz frequency.

The top plasma may be left at low or no power when the bottom plasma in the substrate processing region 570 is turned on to either cure a film or clean the interior surfaces bordering substrate processing region 570. A plasma in substrate processing region 570 is ignited by applying an AC voltage between showerhead 553 and the pedestal or bottom of the chamber. A cleaning gas may be introduced into substrate processing region 570 while the plasma is present.

The pedestal may have a heat exchange channel through which a heat exchange fluid flows to control the temperature of the substrate. This configuration allows the substrate temperature to be cooled or heated to maintain relatively low temperatures (from 0° C. through about 120° C.). The heat exchange fluid may comprise ethylene glycol and water. The wafer support platter of the pedestal (preferably aluminum, ceramic, or a combination thereof) may also be resistively heated in order to achieve relatively high temperatures (from about 120° C. through about 1100° C.) using a single-loop embedded heater element. An outer portion of the heater element may run adjacent to a perimeter of the support platter, while an inner portion runs on the path of a concentric circle having a smaller radius. The wiring to the heater element passes through the stem of the pedestal.

The substrate processing system is controlled by a system controller. In an exemplary embodiment, the system controller includes a hard disk drive, a floppy disk drive and a processor. The processor contains a single-board computer (SBC), analog and digital input/output boards, interface boards, and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

The system controller controls all of the activities of the CVD machine. The system controller executes system control software, which is a computer program stored in a computer-readable medium. Preferably, the medium is a hard disk drive, but the medium may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to instruct the system controller.

A process for depositing a film stack on a substrate or a process for cleaning a chamber can be implemented using a computer program product that is executed by the system controller. The computer program code can be written in any conventional computer readable programming language such as 68000 assembly language, C, C++, Pascal, Fortran or others. Suitable program code is entered into a single or multiple files using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Having described several embodiments, it will be recognized by those of skill in the art that various modifications, alternative constructions, combinations, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

What is claimed is:

1. A method of forming air gaps between adjacent raised features on a substrate, the method comprising:
    forming a first silicon-containing film using a flowable deposition process, the first silicon-containing film filling a lower region between the adjacent raised features;
    forming a carbon-containing material on top of the first silicon-containing film in between the adjacent raised features using a flowable deposition process;
    forming a second silicon-containing film over the carbon-containing material, the second silicon-containing film filling an upper region between the adjacent raised features and extending over the adjacent raised features; and
    curing the carbon-containing material and the first and second silicon-containing films at an elevated temperature for a period of time to form the air gaps between the adjacent raised features;
    wherein the adjacent raised features create a trench and the flowable deposition process fills the trench from a bottom of the trench upwards towards a top of the trench; and
    wherein the first silicon-containing film forms a thin layer on sidewalls of the adjacent raised features, the thin layer extending from a bottom of the trench along only a lower portion of the sidewalls.

2. The method of claim 1 wherein the carbon-containing material is formed using a flowable chemical vapor deposition (CVD) process.

3. The method of claim 1 wherein the carbon-containing material comprises a carbon-doped silicon oxide material.

4. The method of claim 1 wherein the carbon-containing material comprises a hydrocarbon material.

5. The method of claim 1 wherein the carbon-containing material is substantially free of silicon.

6. The method of claim 1 wherein the cure includes exposure to an oxygen-containing atmosphere at the elevated temperature.

7. The method of claim 1 wherein the cure removes carbon from the carbon-containing material to provide a porous oxide and the air gaps comprises one or more pores of the porous oxide.

8. The method of claim 1 wherein the carbon-containing material is substantially removed during the cure such that at least one of the air gaps extend from a first one of the adjacent raised features to a second one of the adjacent raised features.

9. The method of claim 1 wherein the first silicon-containing film is formed using a flowable chemical vapor deposition (CVD) process.

10. The method of claim 1 wherein the first and second silicon-containing films consist essentially of silicon oxide.

11. The method of claim 1 wherein the first and second silicon-containing films are substantially free of carbon.

12. The method of claim 1 wherein a density of the first and second silicon-containing films increase after the cure and the second silicon-containing film extends over the air gap.

13. A method of forming air gaps between adjacent raised features on a substrate, the method comprising:
    forming a first silicon-containing film using a flowable chemical vapor deposition (CVD) process, the first silicon-containing film filling a lower region between the adjacent raised features, the first silicon-containing film being substantially free of carbon;
    forming a carbon-containing material on top of the first silicon-containing film between the adjacent raised features using a deposition process, the carbon-containing material being substantially free of silicon;

forming a second silicon-containing film over the carbon-containing material using a flowable chemical vapor deposition (CVD) process, the second silicon-containing film filling an upper region between the adjacent raised features and extending over the adjacent raised features, the second silicon-containing film being substantially free of carbon; and curing the carbon-containing material and the first and second silicon-containing films at an elevated temperature for a period of time to form the air gaps between the adjacent raised features, the elevated temperature being higher than a decomposition temperature of the carbon-containing material, wherein the carbon-containing material is substantially removed during the cure such that at least one of the air gaps extend from a first one of the adjacent raised features to a second one of the adjacent raised features;

wherein the adjacent raised features create a trench and the flowable deposition process fills the trench from a bottom of the trench upwards towards a top of the trench; and wherein the first silicon-containing film forms a thin layer on sidewalls of the adjacent raised features, the thin layer extending from a bottom of the trench along only a lower portion of the sidewalls.

14. The method of claim 13 wherein the carbon-containing material comprises a hydrocarbon material.

15. The method of claim 13 wherein the carbon-containing material comprises a carbon-doped silicon oxide material.

16. The method of claim 13 wherein the carbon-containing material is formed using a flowable chemical vapor deposition (CVD) process.

17. The method of claim 13 wherein the carbon-containing material is formed using a spin-on deposition process.

18. The method of claim 13 wherein the cure includes exposure to an oxygen-containing atmosphere at the elevated temperature.

19. The method of claim 13 wherein a density of the first and second silicon-containing films increase after the cure and the second silicon-containing film extends over the air gaps.

20. A method of forming air gaps between adjacent raised features on a substrate, the method comprising:

forming a first silicon-containing film using a flowable chemical vapor deposition (CVD) process, the first silicon-containing film filling a lower region between the adjacent raised features, the first silicon-containing film being substantially free of carbon;

forming a carbon-containing material on top of the first silicon-containing film between the adjacent raised features using a deposition process, the carbon-containing material being substantially free of silicon;

repeating the forming a first silicon-containing film and the forming a carbon-containing film until a desired gap fill has been achieved;

forming a final silicon-containing film over the carbon-containing material using a flowable chemical vapor deposition (CVD) process, the final silicon-containing film filling an upper region between the adjacent raised features and extending over the adjacent raised features, the final silicon-containing film being substantially free of carbon; and curing the carbon-containing materials and the silicon-containing films at an elevated temperature for a period of time to form the air gaps between the adjacent raised features, the elevated temperature being higher than a decomposition temperature of the carbon-containing material, wherein the carbon-containing materials are substantially removed during the cure such that at least one of the air gaps extend from a first one of the adjacent raised features to a second one of the adjacent raised features;

wherein the adjacent raised features create a trench and the flowable deposition process fills the trench from a bottom of the trench upwards towards a top of the trench; and wherein the first silicon-containing film forms a thin layer on sidewalls of the adjacent raised features, the thin layer extending from a bottom of the trench along only a lower portion of the sidewalls.

21. The method of claim 1 wherein the first silicon-containing film that fills the lower region between the adjacent raised features has a first thickness in the lower region and the thin layer on the sidewalls of the adjacent raised features has a second thickness, and the first thickness is greater than the second thickness.

22. The method of claim 1 wherein the adjacent raised features have a first height extending from the substrate to the top of the adjacent raised features and the lower portion of the sidewalls has a height that is less than the first height.

23. The method of claim 1 wherein the flowable deposition process used to deposit the first silicon-containing film is a non-uniform deposition process, depositing a thicker layer on the substrate than on the sidewalls of the adjacent raised features.

24. The method of claim 13 wherein the first silicon-containing film that fills the lower region between the adjacent raised features has a first thickness in the lower region and the thin layer on the sidewalls of the adjacent raised features has a second thickness, and the first thickness is greater than the second thickness.

25. The method of claim 13 wherein the adjacent raised features have a first height extending from the substrate to the top of the adjacent raised features and the lower portion of the sidewalls has a height that is less than the first height.

26. The method of claim 13 wherein the flowable deposition process used to deposit the first silicon-containing film is a non-uniform deposition process, depositing a thicker layer on the substrate than on the sidewalls of the adjacent raised features.

* * * * *